United States Patent

Schmitt et al.

[11] Patent Number: 5,847,399
[45] Date of Patent: Dec. 8, 1998

[54] DEFLECTION SYSTEM

[75] Inventors: Reinhold Schmitt, Munich; Stefan Lanio, Erding; Thomas Jasinski, Munich, all of Germany

[73] Assignee: ACT Advanced Circuit Testing Gesellschaft fur Testsystementwicklung mbH, Munich, Germany

[21] Appl. No.: 876,876

[22] Filed: Jun. 16, 1997

[30] Foreign Application Priority Data

Jul. 25, 1996 [EP] European Pat. Off. ............. 96112018

[51] Int. Cl.⁶ ........................... H01J 37/09; H01J 37/147
[52] U.S. Cl. .................................... 250/396 ML
[58] Field of Search ....................... 250/396 ML

[56] References Cited

U.S. PATENT DOCUMENTS 3,984,687  10/1976  Loeffler et al. ............. 250/396 ML
4,701,623  10/1987  Beasley .......................... 250/396 ML
4,798,953   1/1989  De Chambost ............... 250/396 ML

*Primary Examiner*—Jack I. Berman
*Attorney, Agent, or Firm*—Reising, Ethington, Learman & McCulloch, PLLC

[57] ABSTRACT

A deflection system (6) for a charged particle beam (2), in particular for arrangement in an objective lens for a charged particle beam device with a deflection means (60) for generating a magnetic field acting on the charged particle beam (2) and a shield (61) for avoiding eddy currents, which surrounds the deflection means and guides the formed outer magnetic field. The shield (61) consists, transversely to the direction of the charged particle beam (2), of at least one soft magnetic layer which is preferably formed as a strip material and rolled up to a cylinder together with an electrically insulating layer.

16 Claims, 2 Drawing Sheets

DEFLECTION SYSTEM

The invention relates to a deflection system for a charged particle beam and a charged particle beam device and/or an objective lens with such a deflection system.

It must be possible to rapidly deflect the charged particle beam in charged particle beam devices and, here, in particular in electron beam devices such as scanning microscopes, electron beam lithography systems and electron beam testers. This is necessary both for scanning the surface during imaging operations and for structure generation in electron beam lithography systems. It is aimed at carrying out the scanning of the electron beam as quickly as possible in order to firstly make a rapid impression of image and secondly a rapid structuring in the electron beam lithography system possible.

A basic differentiation is made between magnetic and electrostatic deflection in beam deflection.

Magnetic deflectors have the advantage that they may be disposed outside the vacuum and, due to this, they can be integrated into the charged particle beam device problem-free, relatively speaking. However, the eddy currents formed by the electrically conductive material in the neighbourhood of the magnetic deflector have a detrimental effect. These eddy currents also generate deflection fields which counteract those of the magnetic deflector. Since these eddy currents increase with higher frequencies, magnetic deflectors are limited to high deflection frequencies in their frequency behaviour.

Electrostatic deflectors, on the other hand, are not limited in their frequency behaviour. The electrical fields are generated by electrodes near the charged particle beam. However, the disadvantage of these electrodes consists in that they may get contaminated and that insulating cover layers may be formed. These may be charged by the charged particle beam resulting in uncontrolled beam deflections. For this reason, magnetic deflection systems are in general preferred inasmuch as this is permitted by their frequency behaviour.

So far, the most different efforts have been made to limit and/or minimise the influence of eddy currents as much as possible. In general, there are two types of eddy currents:

1. The first type of eddy currents is formed in the beam liner tube which separates the deflection system from the beam and which is disposed in the interior of the deflector. In order to minimise this influence, either the wall thickness of the tube is made as thin as possible and/or the tube is made of a material with a poor electrical conductivity.

A further production method is the use of an electrically insulating tube which is coated with a thin, conductive layer on the side facing the beam in order to avoid charging by the charged particle beam. Both measures aim at making the electrical resistance for the eddy currents as high as possible in order to attenuate them.

2. The second type of eddy currents is formed in the material surrounding the deflection system at its outside. This material is e.g. formed by the iron environment of a magnetic lens if the deflection system is disposed in the inner bore of the magnetic lens. Then, the deflection currents generate eddy currents in the surrounding, solid, electrically conductive material, whose magnetic fields weaken the deflection fields.

In order to avoid these outer eddy currents it is known from practice to provide the deflection means with a shield. This shield is customarily formed by a ferrite cylinder. These ferrite cylinders have the positive properties of guiding the magnetic flux, since they have a high permeability and are, at the same time, electrically insulating. Due to this, they can carry the outer magnetic field and conduct it to the opposite magnetic coil half of the deflection means without the field penetrating into the surrounding material. Since the ferrite material is electrically non-conductive, eddy currents are thus neither generated in the ferrite cylinder nor in the surrounding material, in general in the lens body.

The shields made of ferrite have, however, the disadvantage that it is very difficult to process them. Substantially, they can only be ground. Moreover, the existing installation space for such shields is relatively small so that shields being as thin as possible are desirable. However, due to the poor processability it is very difficult to produce thin shields with ferrite material. Finally, ferrite material has in general a high remanence which results in remaining residual fields after the switching off of the magnetic fields which result in an uncontrolled deflection of the charged particle beam.

Consequently, the invention is based on the object of providing a shield for the deflection system which avoids the aforementioned disadvantages and can be produced particularly easily.

This object is attained according to the invention by the characterising features of claims 1, 6, 13, 14, 15 and 16.

One solution according to the invention consists in that the shield consists transversely to the direction of the charged particle beam of at least of one soft magnetic layer and an electrically insulating layer.

According to a second solution according to the invention the shield consists of a soft magnetic and electrically insulating strip material which is rolled up to a cylinder.

Since the soft magnetic layer is formed as a strip material, the shield can be produced especially easily as a wound package. The wall thickness of the shield depends in particular on the magnetic field to be shielded.

Especially a thin cylinder can be produced by means of the soft magnetic strip material so that the shield can be used especially advantageously under narrow spatial conditions.

Further developments of the invention are the subject matter of the sub-claims and are explained in greater detail by means of the description of an example of embodiment and the drawing.

Figure 1:
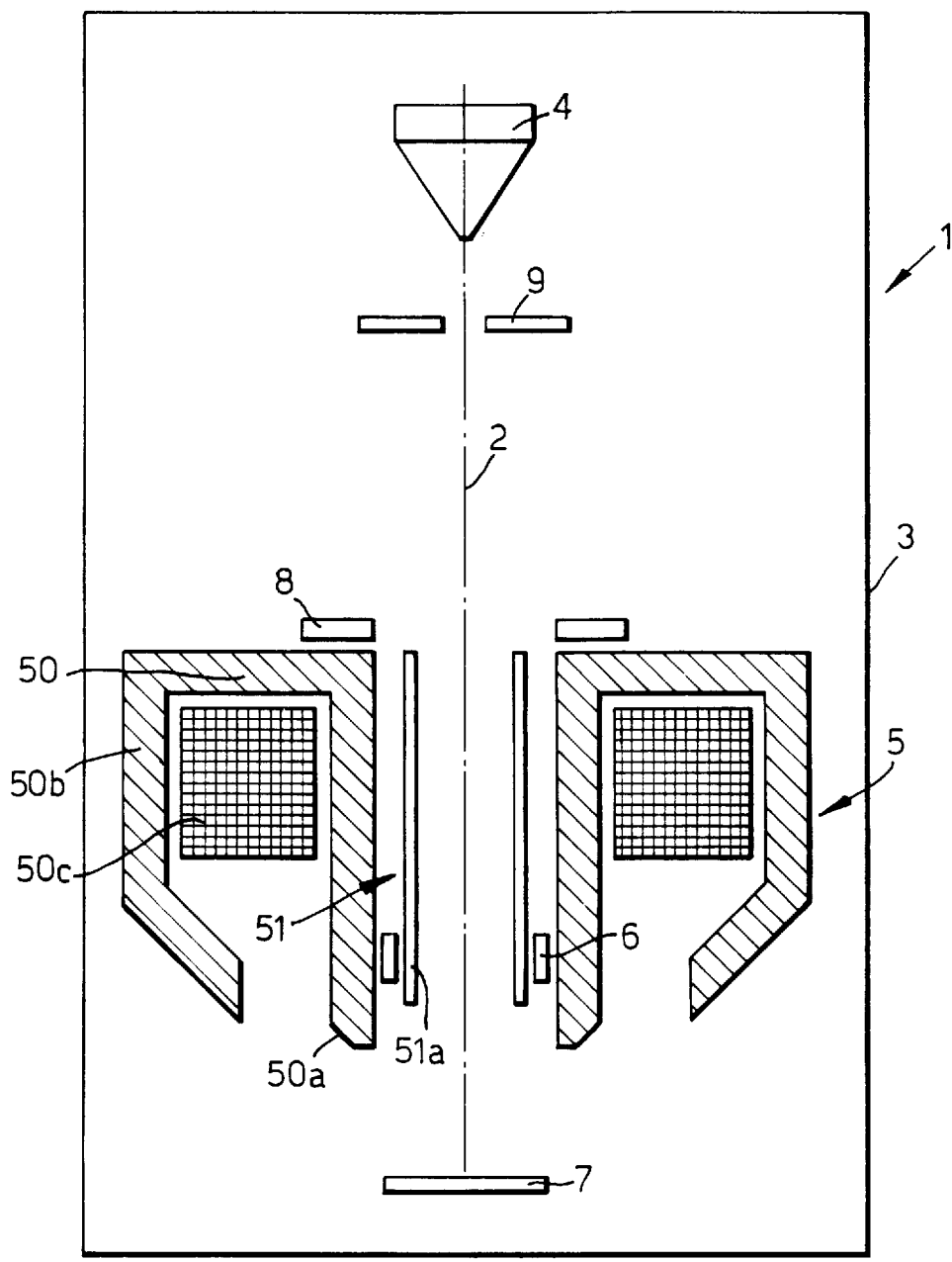
FIG. 1 shows a schematic representation of a charged particle beam device.

FIG. 1 shows a charged particle beam device 1 with which a bundled charged particle beam 2, e.g. an electron beam, can be produced in an optical column 3. This column 3 comprises, in addition to a plurality of magnetic and/or electrical lenses and diaphragms for beam formation (not shown here), a source 4 for generating the charged particle beam 2 and an objective lens 5 for focussing the charged particle beam on a specimen 7.

A deflection system 6 is provided within the objective lens 5 in order to deflect the charged particle beam 2 as this is e.g. necessary when scanning the specimen 7. Moreover, a detector 8 is disposed above the objective lens 5 in order to receive the charged particles released at the specimen 7. Moreover a blanking system 9 may be provided, if required.

The objective lens 5 consists substantially of a magnetic lens 50 which is formed in the present case as a single-pole lens and an electrostatic lens 51 disposed within the magnetic lens. The electrostatic lens has two electrodes which can be acted upon with different potentials in such fashion that the charged particles, e.g. the electrons, are decelerated in the field of the electrostatic lens from a first to a lower second energy. In the represented example of embodiment the first electrode is formed by a beam tube 51a and the second electrode is formed by the lower end of the inner pole piece 50a connected to ground. However, the second electrode could also be formed by a separate electrode.

The magnetic lens 50 consists of an inner pole piece 50a and an outer pole piece 50b which is partly conically formed in the represented example of embodiment. An excitation coil 50c is provided for exciting the magnetic lens 50.

The detector 8 is disposed laterally of the optical axis of the optical column 3 and comprises two opposite detector elements. Apart from that, the detector is designed in a manner known per se, e.g. with a scintillator or as a secondary charged particle spectrometer.

In another example of embodiment not represented in greater detail the detector may also be disposed coaxially to the optical axis of the optical column 3.

Depending upon the application, the detector may have a subdivided detector surface whose output signals can be processed separately from each other.

The deflection system 6 is disposed in the interior of the magnetic lens 50 between the inner wall formed by the inner pole piece 50a and the beam tube 51a. The more detailed design of the deflection system 6 will be explained in greater detail in the following by means of FIG. 2 and 3:

According to the invention the deflection system 6 consists of a deflection means 60 for generating a magnetic field acting on the charged particle beam 2 and a shield 61 for avoiding eddy currents, which surrounds the deflection means and guides the formed outer magnetic field.

The deflection means 60 is e.g. formed by a saddle coil or a toroid.

The shield 61 consists, transversely to the direction of the charged particle beam 2, of at least one soft magnetic layer 61a and an electrically insulating layer 61b. The two layers 61a 61b are preferably wound together in the form of a cylinder, several layers being superimposed. In the represented example of embodiment the shield consists of two soft magnetic layers 61a and two electrically insulating layers 61b.

An especially simple processing can be achieved if the soft magnetic layer 61 is formed as a strip material. The electrically insulating layer 61b consists e.g. of a plastic material and is applied onto the soft magnetic layer as an adhesive layer. However, other types of connection of the two layers, e.g. by means of vapour deposition or similar processes are also conceivable. The layer thickness of the electrically insulating layer is preferably less than 100 $\mu$m.

Figure 2:
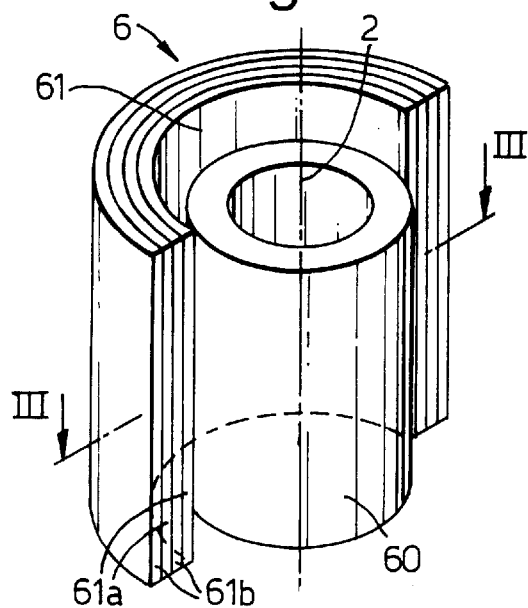
FIG. 2 shows a schematic representation of the deflection system according to the invention.
Figure 3:
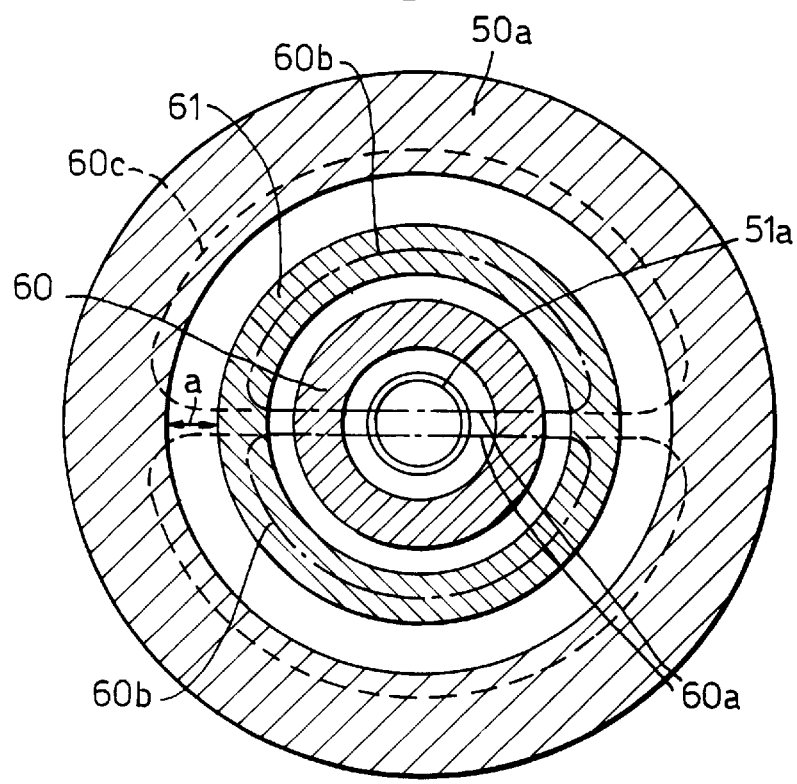
FIG. 3 shows a sectional view along line III—III of FIG. 2.

FIG. 3 shows a section along line III—III of FIG. 2, the inner pole piece 50a of the magnetic lens 50 being additionally represented. A deflection field can be generated in the interior of the beam tube 51a with the deflection system as it is represented in FIG. 3 by way of example by means of field lines 60a. The deflection means 60 and the shield 61 must be designed and arranged in such a fashion that the formed outer magnetic field (field line 60b) is carried by the shield 61 and guided to the other side of the deflection means.

If the distance a between the magnetic lens, i.e. the inner pole piece 50a, and the shield 61 is too small, an undesired transfer of the field into the inner pole piece may occur as it is shown by the field lines 60c represented in broken lines. The same effect also occurs if the wall thickness of the shield 61 is too small so that a saturation occurs in the shield 61.

Since the inner pole piece 50a is a massive, electrically conductive material, undesired eddy currents are formed in the case of a transfer of the field lines which counter-act the deflection field (field line 60a). In order to prevent the formation of the undesired field (field line 60c) in the interior of the pole piece 50a, the wall thickness of the shield 61c is adapted, on the one hand, in such a fashion to the magnetic field generated by the deflection means 60 that a saturation does not occur in the shield and, on the other, the distance a must be selected sufficiently large. The small installation space within the pole piece 50a, however, is opposed to these two conditions.

Consequently, according to the invention a soft magnetic material is suggested for the shield, which distinguishes itself by a high relative permeability and a high saturation induction.

Iron-cobalt-nickel alloys can in particular be used as soft magnetic materials.

Soft magnetic materials with a relative permeability Pr $\mu_r > 10,000$ and a saturation induction of more than 0.2 T come in particular into consideration for the shield 61 according to the invention.

The high remanence also has had an especially detrimental effect in the ferrite shields used so far, which gives rise to remaining residual fields after the switching off of the magnetic fields. These problems can be reduced to a great extent, when a soft magnetic material with a coercive field strength of less than 4 A/m is used.

It proved to be especially advantageous in the tests on which the invention is based, if a soft magnetic strip material with a thickness of less than 500 $\mu$m, preferably less than 100 $\mu$m, is used. This strip material is then wound to a cylinder together with the insulating layer in a simple manner, the number of windings being selected large so that a sufficient saturation capacity is achieved.

If the deflection system is used in an objective lens for a charged particle beam device, shields with a wall thickness of less than 1 mm can be achieved in this fashion. Due to these wall thicknesses being relatively small as compared with customary ferrite cylinders, a substantially more compact construction of the deflection system can be achieved.

In a second example of embodiment according to the invention the shield is formed of a soft magnetic strip material which is also electrically insulating and is rolled to a cylinder. In this shield, as well, that many windings are used for producing the shield that a sufficient saturation capacity is given for the generated magnetic field.

The shields according to the invention are distinguished by a very simple production and a compact construction. Due to the latter feature the deflection system can be installed especially advantageously in objective lenses for charged particle beam devices, where only a relatively small installation space is available.

We claim:

1. A deflection system (6) for a charged particle beam (2) comprising a deflection means (60) for generating a magnetic field acting on the charged particle beam, and a shield (61) for avoiding eddy currents, which surrounds the deflection means and guides the formed outer magnetic field, characterised in that the shield (61) consists of at least one soft magnetic layer (61a) and an electrically insulating layer (61b) transversely to the direction of the charged particle beam (2).

2. A deflection system according to claim 1, characterised in that the shield (61) is cylindrically formed.

3. A deflection system according to claim 1, characterised in that the soft magnetic layer (61a) is formed as a strip material which is rolled up to a cylinder together with the electrically insulating layer (60b).

4. A deflection system according to claim 1, characterised in that an iron-cobalt-nickel alloy is used for the soft magnetic layer (61a).

5. A deflection system according to claim 1, characterised in that the electrically insulating layer (61b) has a layer thickness of less than 100 μm.

6. A deflection system (6) for a charged particle beam (2) comprising
   a deflection means (60) for generating a magnetic field acting on the charged particle beam, and
   a shield (61) for avoiding eddy currents, which surrounds the deflection means and guides the formed outer magnetic field,
   characterised in that the shield (61) consists of a soft magnetic and electrically insulating strip material rolled up to a cylinder.

7. A deflection system according to claim 1 or 6, characterised in that the layer thickness of the soft magnetic layer (61a) is less than 500 μm, preferably less than 100 μm.

8. A deflection system according to claim 1 or 6, characterised in that the relative permeability $\mu_r$ of the soft magnetic layer is higher than 10,000.

9. A deflection system according to claim 1 or 6, characterised in that the shield (61) has a wall thickness of less than 1 mm.

10. A deflection system according to claim 1 or 6, characterised in that the coercive field strength of the soft magnetic layer (61a) is less than 4 A/m.

11. A deflection system according to claim 1 or 6, characterised in that the saturation induction of the soft magnetic layer is more than 0.2 T.

12. A deflection system according to claim 1 or 6, characterised in that the number of layers is at least selected so large that, due to the formed outer magnetic field, no saturation takes place in the shield (61).

13. An objective lens (5) for a charged particle beam device (1) comprising
   a) a magnetic lens (50) for focussing a charged particle beam (2), and
   b) a deflection system (6) disposed within the magnetic lens (50), containing
      b1) a deflection means (60) for generating a magnetic deflection field and
      b2) a shield (61) for avoiding eddy currents, which surrounds the deflection means and guides the formed outer magnetic deflection field,
   characterised in that the shield (61) consists of at least one soft magnetic layer (61a) and an electrically insulating layer (61b) transversely to the direction of the charged particle beam (2).

14. An objective lens (5) for a charged particle beam device (1) comprising
   a) a magnetic lens (50) for focussing a charged particle beam (2), and
   b) a deflection system (6) disposed within the magnetic lens (50), containing
      b1) a deflection means (60) for generating a magnetic deflection field and
      b2) a shield (61) for avoiding eddy currents, which surrounds the deflection means and guides the formed outer magnetic deflection field,
   characterised in that the shield consists of a soft magnetic and electrically insulating strip material rolled up to a cylinder.

15. A charged particle beam device (1) comprising
   a) a source (4) for generating a charged particle beam (2),
   b) and an objective lens (5) having
      b1) a magnetic lens (50) for focussing a charged particle beam (2) and
      b2) a deflection system (6) disposed within the magnetic lens (50), containing
         b21) a deflection means (60) for generating a magnetic deflection field and
         b22) a shield (61) for avoiding eddy currents, which surrounds the deflection means and guides the formed outer magnetic deflection field,
   characterised in that the shield (61) consists of at least one soft magnetic layer (61a) and an electrically insulating layer (61b) transversely to the direction of the charged particle beam (2).

16. A charged particle beam device (1) comprising
   a) a source (4) for generating a charged particle beam (2),
   b) and an objective lens (5) having
      b1) a magnetic lens (50) for focussing a charged particle beam (2) and
      b2) a deflection system (6) disposed within the magnetic lens (50), containing
         b21) a deflection means (60) for generating a magnetic deflection field and
         b22) a shield (61) for avoiding eddy currents, which surrounds the deflection means and guides the formed outer magnetic deflection field,
   characterised in that the shield consists of a soft magnetic and electrically insulating strip material rolled up to a cylinder.

* * * * *

UNITED STATES PATENT AND TRADEMARK OFFICE
CERTIFICATE OF CORRECTION

PATENT NO. : 5,847,399
DATED : December 8, 1998
INVENTOR(S) : Reinhold Schmitt, Stefan Lanio and Thomas Jasinski It is certified that error appears in the above-indentified patent and that said Letters Patent is hereby corrected as shown below:

Column 4, bridging lines 17 and 18, change "Prµ" to -- $\mu_r$ --.

Signed and Sealed this

Thirtieth Day of March, 1999

Attest:

Q. TODD DICKINSON

Attesting Officer

Acting Commissioner of Patents and Trademarks